United States Patent [19]

Holland

[11] Patent Number: 4,688,268
[45] Date of Patent: Aug. 18, 1987

[54] FIBER OPTIC RECEIVER HAVING A COMBINED BASELINE CLAMP AND AUTOMATIC GAIN CONTROL DETECTOR

[75] Inventor: John M. Holland, Shawsville, Va.

[73] Assignee: Chevron Research Company, San Francisco, Calif.

[21] Appl. No.: 570,049

[22] Filed: Jan. 11, 1984

[51] Int. Cl.[4] .................................. H04B 9/00
[52] U.S. Cl. ......................... 455/619; 250/214 AG; 330/278; 455/608
[58] Field of Search ............ 455/608, 619, 253; 307/269, 351, 321, 317 A, 264; 328/155, 113, 223; 330/278; 250/214 AG, 214 A

[56] References Cited

U.S. PATENT DOCUMENTS

| | | | |
|---|---|---|---|
| 3,631,263 | 12/1971 | Graham et al. | 307/352 |
| 3,864,529 | 2/1975 | Tracey et al. | 328/151 |
| 3,886,380 | 5/1975 | Sobajima et al. | 307/566 |
| 3,962,549 | 6/1976 | Zuk | 179/16 EA |
| 4,000,397 | 12/1976 | Hebert et al. | 235/462 |
| 4,027,178 | 5/1977 | Larner | 307/269 |
| 4,028,628 | 6/1977 | Rao et al. | 333/14 |
| 4,054,849 | 10/1977 | Yamada | 330/278 |
| 4,074,127 | 2/1978 | Mochida et al. | 455/601 |
| 4,267,595 | 5/1981 | Hernandez | 360/43 |
| 4,376,267 | 3/1983 | Chu et al. | 330/278 |
| 4,415,803 | 11/1983 | Muoi | 250/214 AG |
| 4,495,410 | 1/1985 | Minami et al. | 307/360 |
| 4,499,600 | 2/1985 | Powell et al. | 455/601 |

*Primary Examiner*—Joseph A. Orsino, Jr.
*Attorney, Agent, or Firm*—E. J. Keeling; V. A. Norviel; A. Stephen Zavell

[57] ABSTRACT

A fiber optic receiver having a baseline clamp with two clamping diodes. A first diode has a cathode coupled to a source of a first signal, while a second diode has a cathode coupled to a source of a second signal, identical to the first signal but shifted by 180° in phase from the first signal. The anodes of the two diodes are coupled to each other and to a common potential. A first detecting transistor in an AGC detector has a base connected to the first signal source and to the cathode of the first diode. A second detecting transistor in the AGC detector has a base coupled to the second signal source and to the cathode of the second diode, has an emitter coupled to an emitter of the first transistor, and has a collector coupled to the collector of the first transistor.

10 Claims, 8 Drawing Figures

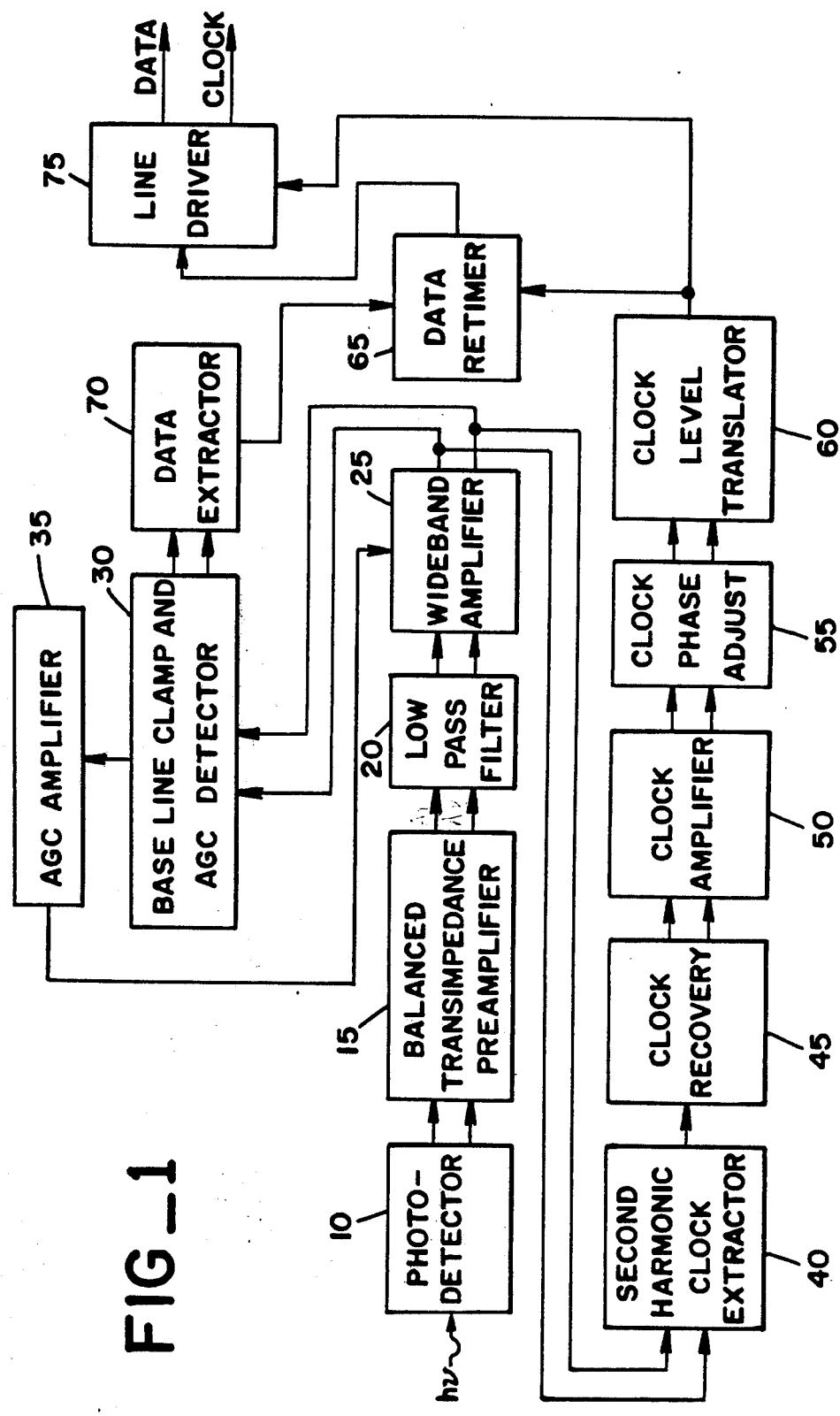
FIG_1

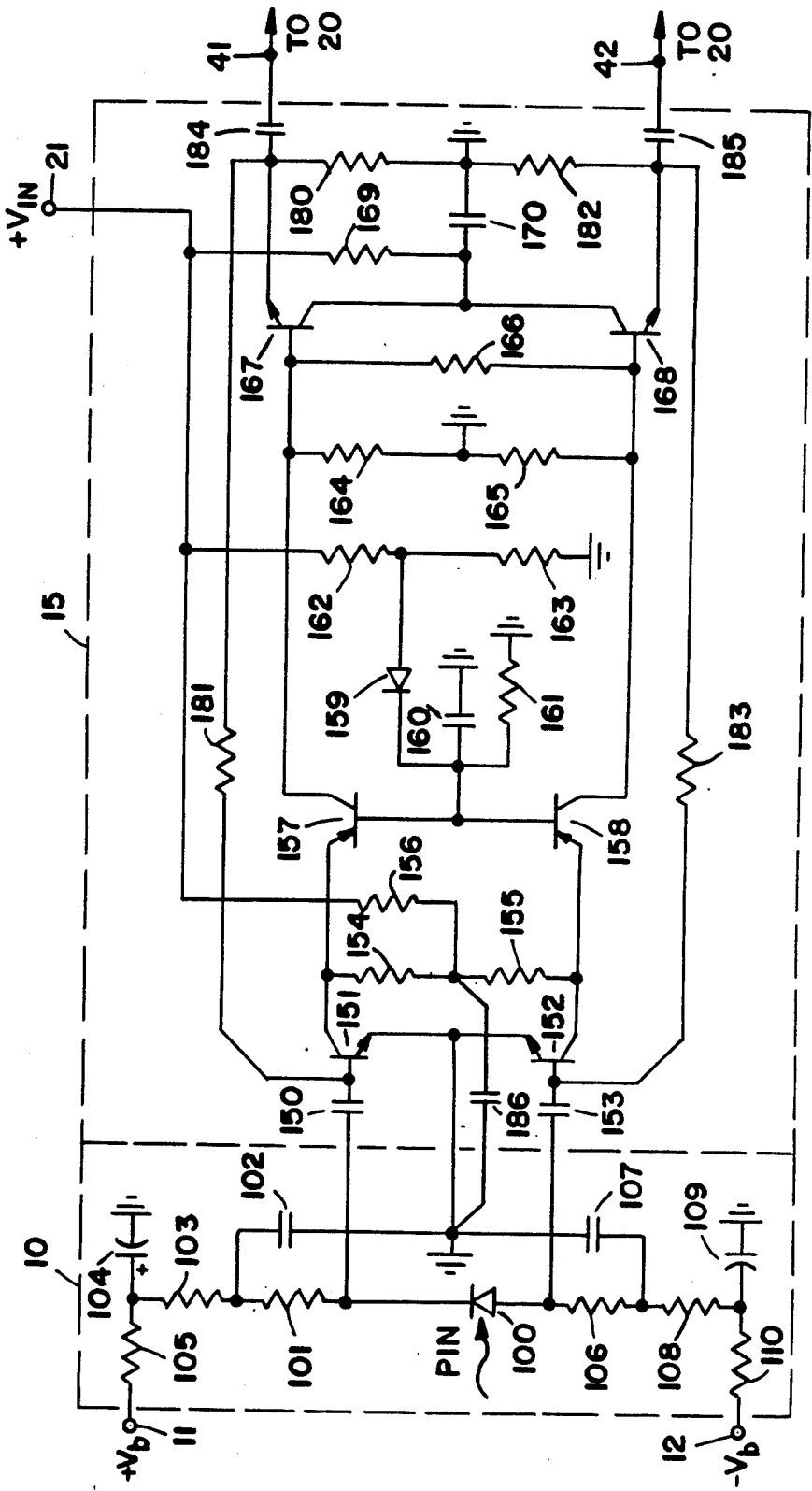
FIG_2

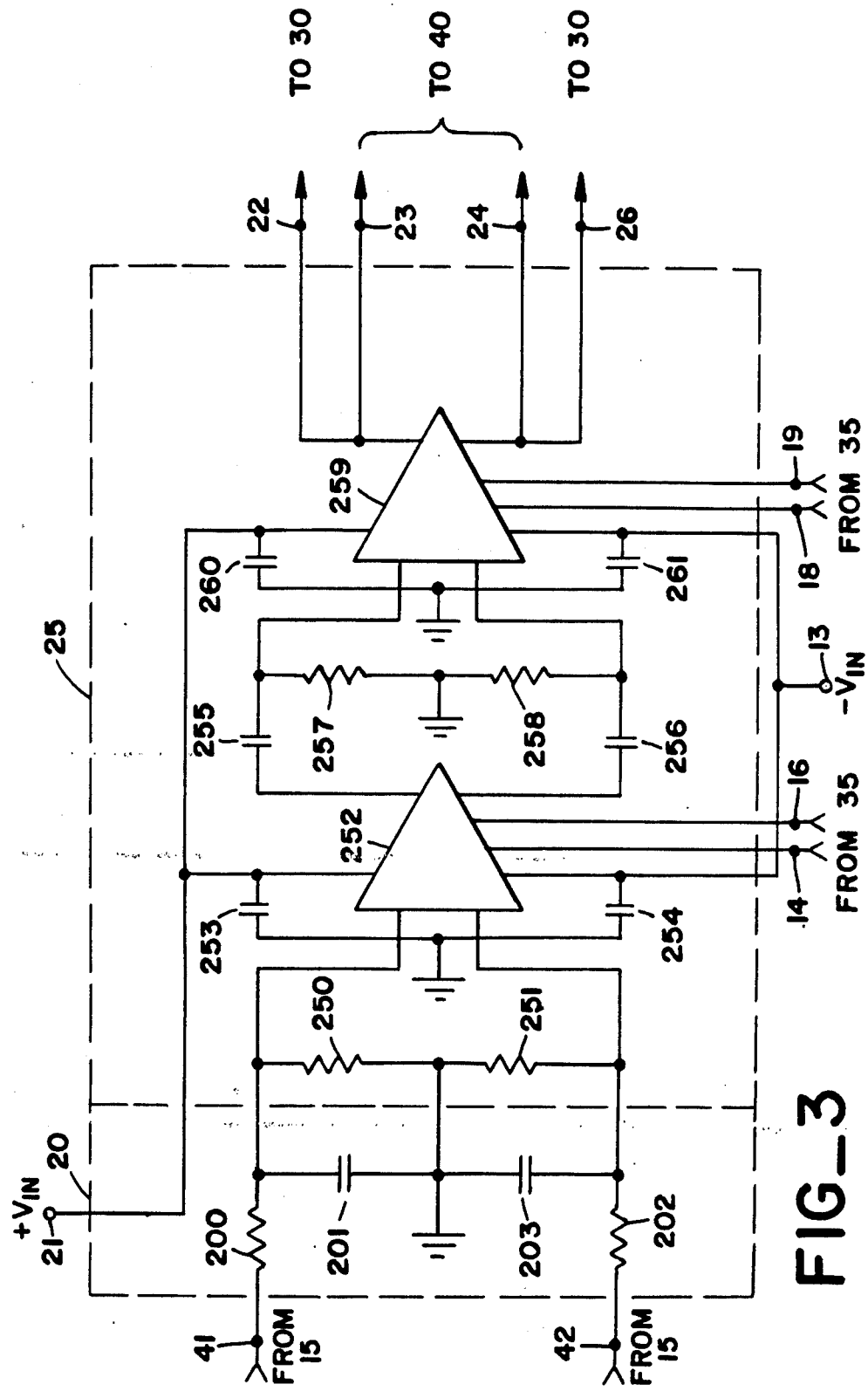
FIG_3

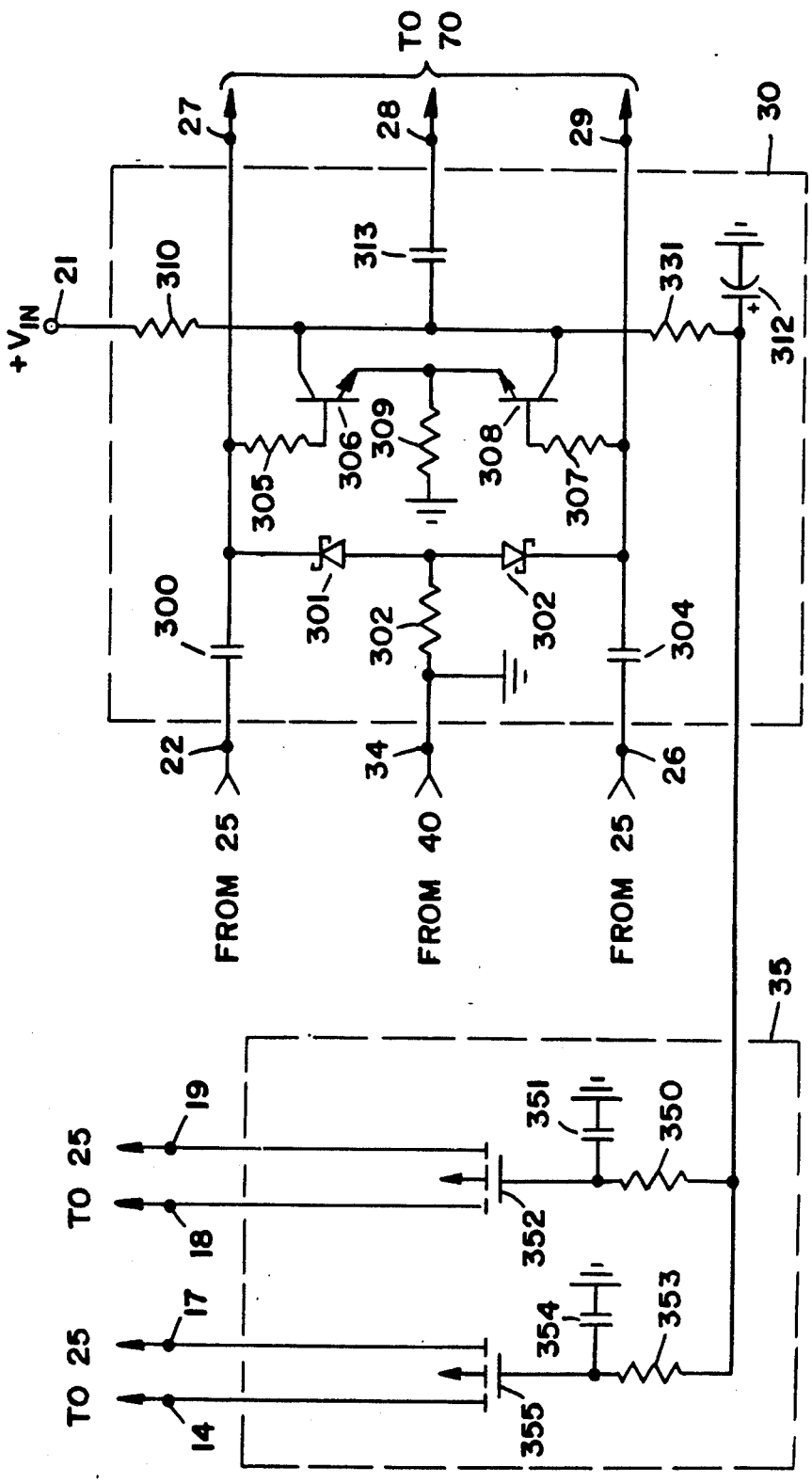
FIG_4

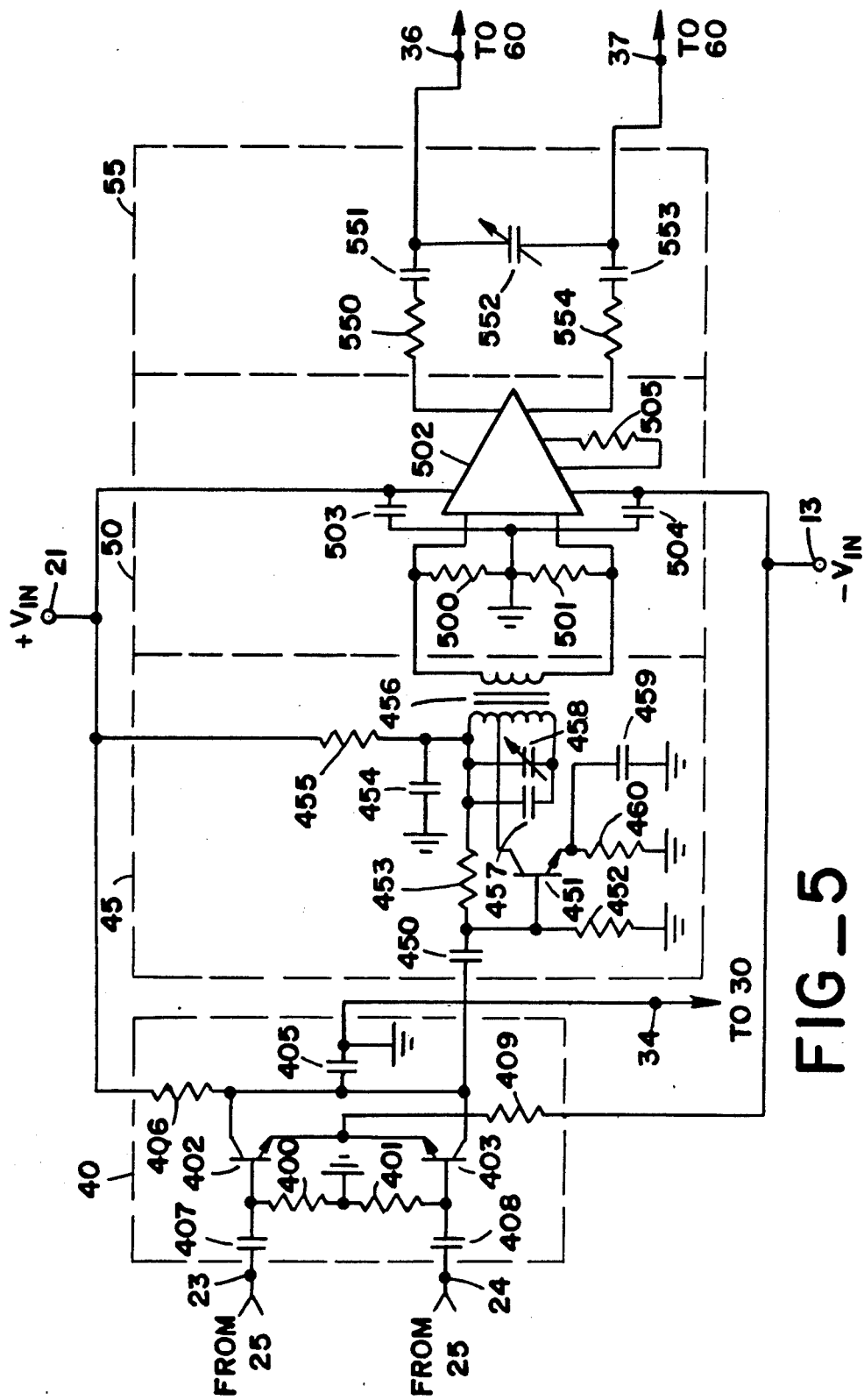
FIG_5

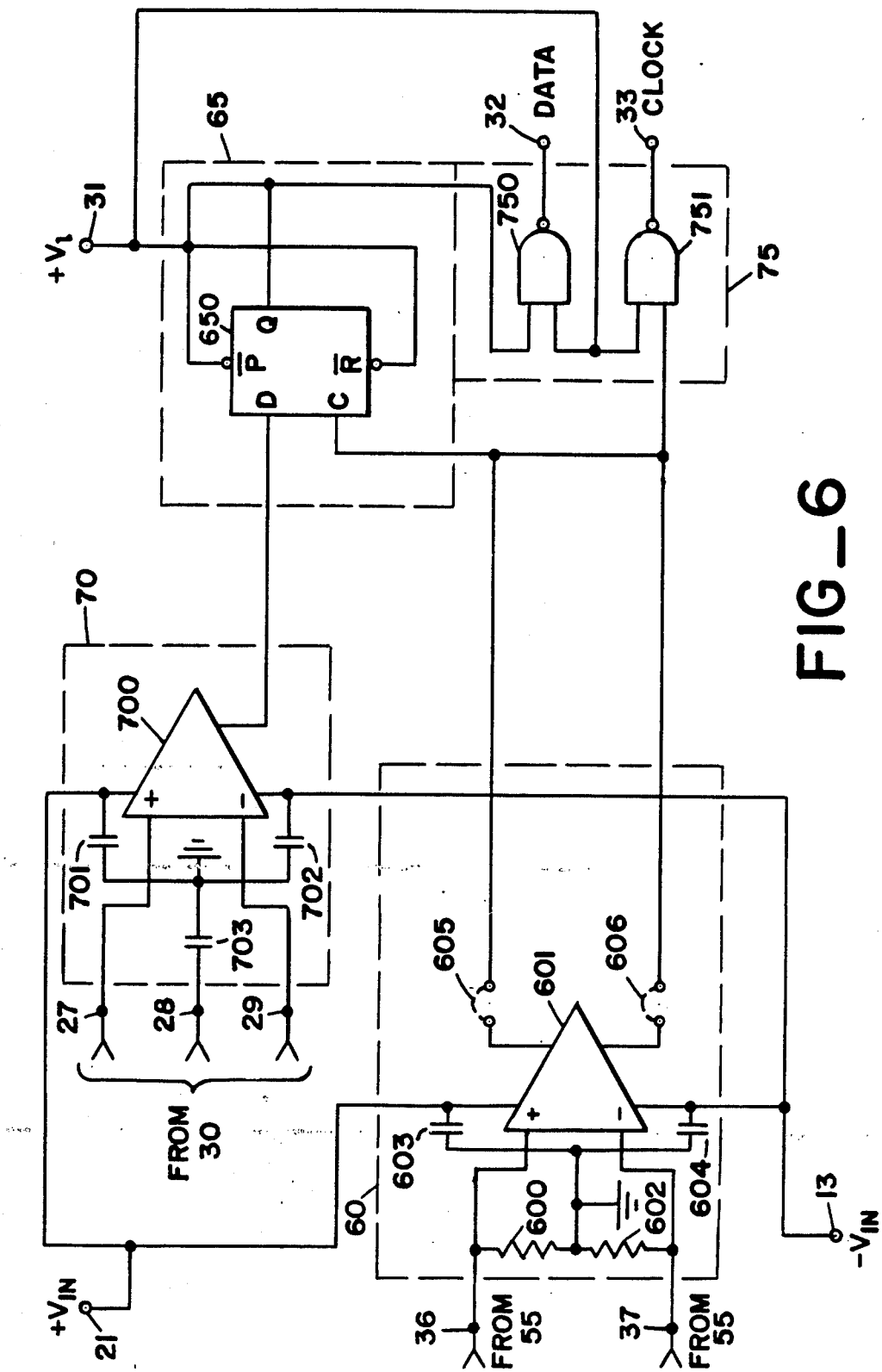
FIG_6

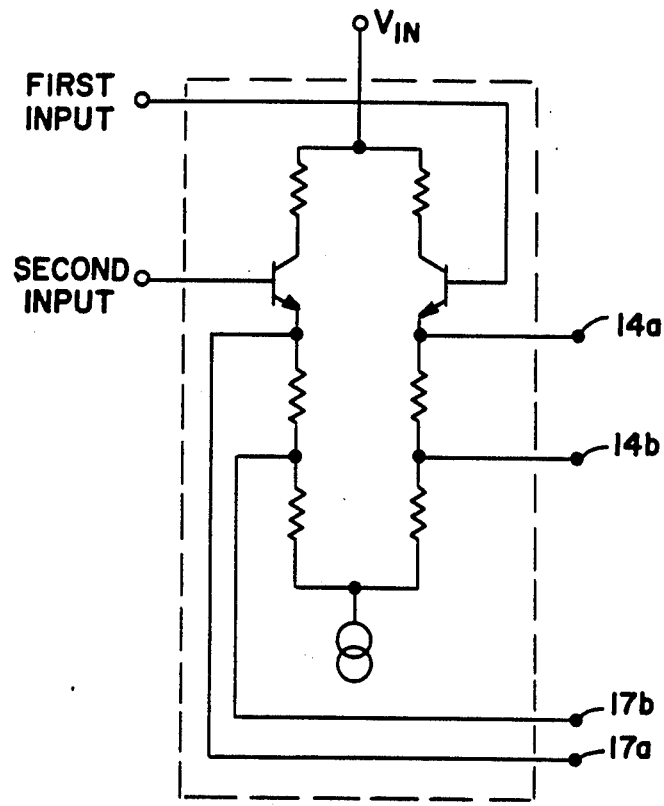
FIG _ 7
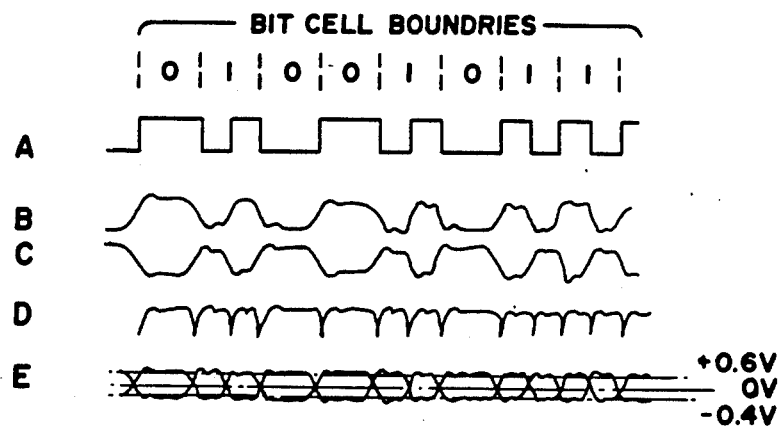
FIG _ 8

FIBER OPTIC RECEIVER HAVING A COMBINED BASELINE CLAMP AND AUTOMATIC GAIN CONTROL DETECTOR

BACKGROUND OF THE INVENTION

The present invention pertains in general to optical receivers and more particularly to fiber optic receivers having automatic gain control.

In fiber optic transmission systems, the intensity of a signal generated within a fiber optic transmitter by a fixed wavelength optical source, such as a light emitting diode (LED) or laser, is commonly modulated by information in the form of an encoded digital data stream. The resulting optical signal is then transmitted along an optical fiber to a fiber optic receiver having a photodetector, such as a PIN diode or an avalanche photo diode (APD). The signal detected by the photodetector is then decoded within the receiver to regenerate a pulse train representing the data stream.

The transmission of large amounts of information per unit of time in a digital system requires that the optical signal be modulated at a high rate. Consequently, the optical signal has a large modulation bandwidth. The power level of the optical signal may also vary widely. A fiber optic receiver must be capable of accurately regenerating the encoded data stream and decoding the data stream into a train of pulses over the entire bandwidth and for a wide range of power levels of the received optical signal.

The ability of the receiver to handle the range of power levels of the received signal, called the dynamic range of the receiver, is commonly increased by connecting the optical detector to a low-noise, fixed-gain amplifier coupled to an automatic gain control (AGC) circuit. The AGC circuit increases the gain of the amplifier at low signal power levels in order to bring faint signals up to an acceptable level and decreases the gain of the amplifier at high signal power levels in order to prevent overloading. Therefore, decreasing the response time of the AGC circuit and improving the overload protection it provides to the receiver allow for more accurate regeneration over a wider dynamic range.

Although there are several other methods for encoding a data stream, the technique of pulse code modulation (PCM) is commonly employed in fiber optic transmission systems. One type of PCM encoding is known as Alternate Mark Inversion (AMI), also referred to as biphase-M. In this type of signaling, the encoder generates a temporal bit cell for each bit of data input to it. At the beginning of each bit cell, there is always a transition from the previous state of the output to the opposite state (i.e., if the output was a logical "1", it will change to a logical "0" and vice versa). This guaranteed transition is used by the receiver logic to determine the cell boundary. Additionally, there will be a transition of the output in the center of the cell if the bit present at the input is a logical "1". (Biphase-S does just the opposite, putting a transition at the center of the cell to represent a logical "0".) Thus, if the input to such an encoder is NRZ (non-return to zero), the output will have frequency components at twice the data input rate. The output will not, however, have frequency components from DC to the data rate.

In order to compensate for shifting of the edges of the bits cells due to noise, the data stream is commonly synchronously decoded. Synchronous decoding involves generating a retiming clock signal within the receiver which retiming clock signal is synchronized with the clock of the encoded data. The retiming clock signal is used to gate the data stream so that the recovered data bits appear at the output of the receiver as a precisely timed pulse train of the sort used to modulate the optical carrier in the transmitter.

Existing retiming circuits commonly use a phase Locked Loop (PLL) which is stimulated by the edges of the bit cells as detected in the form of a derivative of the bit edge. However, this approach produces a relatively noisy signal. Furthermore, PLL circuits are generally complex, have a long transient response time, and have poor reliability.

Another approach to data clock recovery involves determining the position of transitions within a digital signal by sampling the signal and by comparing the sign of successive samples. This approach is relatively expensive in that it requires provision of several comparators and logic circuits in order to sample the signal and in order to determine the zero crossings from the samples.

SUMMARY OF THE INVENTION

Accordingly, the present invention involves a combined baseline clamp and AGC detector including means for providing a first data signal and means for providing a second data signal identical to the first data signal but shifted 180° in phase. A first clamping diode has a first electrode coupled to the means for providing a first data signal and has a second electrode coupled to a common potential. A second clamping diode has a first electrode coupled to the means for providing a second data signal and has a second electrode coupled to the common potential. A first transistor has a base coupled to the first electrode of the first clamping diode. A second transistor has a base coupled to the first electrode of the second clamping diode, an emitter coupled to an emitter of the first transistor, and a collector coupled to the collector of the first transistor.

A feature of the present invention is that it provides automatic gain control and clamping in one circuit with fast response and without loop instability.

A further feature of the present invention is that for each pulse applied to the combined baseline clamp and AGC detector, two pulses are available for firing an AGC amplifier so that the response time of the automatic gain control provided thereby is a factor of 2 faster than for other AGC approaches (this is analogous to full wave detection).

Yet, another feature of the present invention is that it provides optimal sensitivity which allows a transmitter to be operated at a relatively low power level.

BRIEF DESCRIPTION OF THE DRAWINGS

FIG. 1 is a block diagram of a fiber optic receiver according to the present invention;

FIG. 2 is a schematic diagram of a first portion of the fiber optic receiver as illustrated in FIG. 1;

FIG. 3 is a schematic diagram of a second portion of the fiber optic receiver as shown in FIG. 1;

FIG. 4 is a schematic diagram of a third portion of the fiber optic receiver as illustrated in FIG. 1;

FIG. 5 is a schematic diagram of a fourth portion of the fiber optic receiver as shown in FIG. 1;

FIG. 6 is a schematic diagram of a fifth portion of the fiber optic receiver as illustrated in FIG. 1;

FIG. 7 is a simplified schematic diagram of portions of an element of FIG. 3 and FIG. 5; and FIG. 8 is a set of representative waveforms present at various points within the embodiment as shown in FIG. 1.

DESCRIPTION OF THE PREFERRED EMBODIMENT

In a preferred embodiment of a fiber optic receiver having a combined baseline clamp and automatic gain control detector, as illustrated in FIG. 1, a photodetector 10 has a first output and a second output connected to a first and a second input of a balanced transimpedance amplifier 15, respectively. Preamplifier 15 has a first and a second output respectively connected to a first and a second input of a low pass filter 20, which in turn has a first and a second output respectively connected to a first and a second input of a wide band amplifier 25.

Amplifier 25 has a first and a second output respectively connected to first and a second input of a baseline clamp and AGC detector 30. The first and second outputs of amplifier 25 are also respectively connected to a first and a second input of a second harmonic clock extractor 40. An output of clamp and detector 30 is connected to an input of an AGC amplifier 35, which has an output connected to an AGC third input of amplifier 25. Clamp and detector 30 has a first and a second output connected to a first and a second input of a data extractor 70. Extractor 70 has an output connected to a first input of a data retimer 65.

Clock extractor 40 has an output connected to an input of a clock recovery 45, which in turn has a first and a second output respectively connected to a first and a second input of a clock amplifier 50. Clock amplifier 50 has a first and a second output connected to a first and a second input of clock phase adjust 55, which has a first and a second output respectively connected to a first and a second input of clock level translator 60. Translator 60 has an output connected to a second input of retimer 65 and to a first input of a line driver 75. A second input of line driver 75 is connected to an output of retimer 65. Line driver 75 has a data output and a clock output.

In the fiber optic receiver as illustrated in FIG. 1, an optical signal modulated with a biphase AMI data stream impinges on photodetector 10. The output of photodetector 10 is a current signal which is input to the two complementary transimpedance amplifiers where it is converted into a differential voltage output signal. The signal is then filtered by low pass filter 20, and applied to the inputs of amplifier 25.

Amplifier 25 provides two output signals separated by 180° in phase, which output signals are clamped and detected for gain control purposes by clamp and detector 30. An output signal from clamp and detector 30 controls AGC amplifier 35 to provide a signal for controlling the gain of amplifier 25. Clamp and AGC detector 30 provides clamped output signals separated by 180° in phase to data extractor 70, which applies an extracted stream of data to data retimer 65.

The output signals from amplifier 25 are also applied to second harmonic clock extractor 40. Clock extractor 40 provides a single output signal having peaks corresponding to the transitions of the output signals from amplifier 25. From the peaks in the signal from extractor 40, clock recovery 45 regenerates two clock signals at the second harmonic of the data rate of the data stream applied to photodetector 10. The output signals from clock recovery 45 are respectively amplified, adjusted in phase, and converted to a square wave by clock amplifier 50, clock phase adjust 55, and clock level translator 60. The output signal from translator 60 is used to retime the data from extractor 70 in retimer 65. Output signals from retimer 65 and clock level translator 60 are respectively applied to data and clock transmission lines by line driver 75.

As shown in FIG. 2, within photodetector 10, a PIN diode 100 has a cathode connected to a first lead of a resistor 101 which has a second lead connected to a first lead of a capacitor 102 and a first lead of a resistor 103. A second lead of capacitor 102 is connected to ground. A second lead of resistor 103 is connected to a first lead of a capacitor 104, a second lead of which is connected to ground. A first lead of a resistor 105 is connected to the first lead of capacitor 104, while a second lead of resistor 105 is connected to a node 11 at a potential $+V_b$.

An anode of PIN diode 100 is connected to a first lead of a resistor 106 which has a second lead connected to a first lead of a capacitor 107 and to a first lead of a resistor 108. A second lead of capacitor 107 is connected to the second lead of capacitor 102. A second lead of resistor 108 is connected to a first lead of a capacitor 109 and to a first lead of a resistor 110, while a second lead of capacitor 109 is connected to ground. A second lead of resistor 110 is connected to a node 12 which is at a potential of $-V_b$.

Within balanced transimpedance preamplifier 15, a capacitor 150, which has a first lead connected to the cathode of PIN diode 100 in photodetector 10, has a second lead connected to a base of an NPN transistor 151. An emitter of transistor 151 is connected to an emitter of an NPN transistor 152 and to the second lead of capacitor 102. A base of transistor 152 is connected to the first lead of a capacitor 153, which has a second lead connected to the anode of PIN diode 100. A resistor 154 has a first lead connected to a collector of transistor 151 and a second lead connected to a first lead of a resistor 155, a first lead of a resistor 156, and to a first lead of a capacitor 186. A second lead of capacitor 186 is connected to the second lead of capacitor 102.

The collector of transistor 151 is also connected to an emitter of a PNP transistor 157 which has a base connected to a base of a PNP transistor 158. An emitter of transistor 158 is connected to a collector of transistor 152 and to a second lead of resistor 155. The base of transistor 158 is connected to ground across a capacitor 160 and across a resistor 161. The base of transistor 158 is also connected to a cathode of a diode 159 which in turn has an anode connected to a first lead of a resistor 162 and to a first lead of a resistor 163. A second lead of resistor 163 is connected to ground. A first lead of a resistor 164 is connected to a collector of transistor 157. A second lead of a resistor 164 is connected to a first lead of a resistor 165 and to ground, while a second lead of resistor 165 is connected to a collector of transistor 158, to a first lead of a resistor 166, and to a base of an NPN transistor 168. A second lead of resistor 166 is connected to a base of an NPN transistor 167, to the first lead of resistor 164 and to the collector of transistor 157.

A collector of transistor 167 is connected to a collector of transistor 168, to a first lead of a resistor 169 and to a first lead of a capacitor 170. A second lead of capacitor 170 is connected to a first lead of a resistor 180, to a first lead of a resistor 182, and to ground. A second lead of resistor 180 is connected to an emitter of transistor 167, to a first lead of a resistor 181, and to a first lead of a capacitor 184 which has a second lead connected to a node 41. A second lead of resistor 182 is connected to an emitter of transistor 168, to a first lead of a resistor 183, and to a first lead of a capacitor 185 which has a second lead connected to a node 42. A second lead of resistor 181 is connected to the base of transistor 151, while a second lead of resistor 183 is connected to the base of transistor 152.

A second lead of resistor 156, a second lead of resistor 162, and a second lead of resistor 169 are connected to a node 21 which is at a potential of $+V_{in}$. A second lead of capacitor 184 is connected to node 41. A second lead of capacitor 185 is connected to node 42.

Turning now to FIG. 3, elements which are also shown in FIGS. 1 and 2 are identified by the same reference numerals as are used therein. In low pass filter 20, a resistor 200 has a first lead connected to node 41. Resistor 200 has a second lead connected to a first lead of capacitor 201, to a first lead of a resistor 250, and to a first input of an operational amplifier 252. A second lead of capacitor 201 is connected to a first lead of a capacitor 203, to a second lead of resistor 250, to a first lead of a resistor 251, and to ground. A second lead of capacitor 203 is connected to a first lead of a resistor 202 which has a second lead connected to node 42. The second lead of capacitor 203 is also connected to a second lead of resistor 251 and to a second input of operational amplifier 252 in wideband amplifier 155.

Also within amplifier 25, a capacitor 253 has a first lead connected to ground and has a second lead connected to node 21 and to a third input of amplifier 252. A fourth input of amplifier 252 is connected to a first lead of a capacitor 254 and to a node 13 which is at a potential of $-V_{in}$. A second lead of capacitor 254 is connected to the first lead of capacitor 253. A fifth input of amplifier 252 and a sixth input of amplifier 252 are connected to a node 14 and to a node 16, respectively. A first output of amplifier 252 is connected to a first lead of a capacitor 255. A second output of amplifier 252 is connected to a first lead of a capacitor 256. A second lead of capacitor 255 is connected to a first lead of a resistor 257 and to a first input of an operational amplifier 259. A second lead of capacitor 256 is connected to a first lead of a resistor 258 and to a second input of amplifier 259. A second lead of resistor 257 and a second lead of resistor 258 are connected to each other and to ground.

A first lead of a capacitor 260 is connected to ground, while a second lead of capacitor 260 is connected to node 21 and to a third input of amplifier 259. A first lead of capacitor 261 is connected to the first lead of capacitor 260. A second lead of capacitor 261 is connected to a fourth input of amplifier 259 and to node 13. A fifth input of amplifier 259 is connected to a node 18. A sixth input of amplifier 259 is connected to a node 19.

A first output of amplifier 259 is connected to nodes 22 and 23. A second output of amplifier 259 is connected to nodes 24 and 26.

Turning now to FIG. 4, structures which also appear in FIGS. 1, 2 and 3 are identified in FIG. 4 by the same reference numerals used to refer to them in FIGS. 1, 2 and 3.

The first lead of a capacitor 300 within AGC detector 30 is connected to node 22. A second lead of capacitor 300 is connected to a cathode of a Schottky diode 301, to a first lead of a resistor 305, and to a node 27. An anode of diode 301 is connected to a first lead of a resistor 302 and to an anode of a Schottky diode 303. A second lead of resistor 302 is connected to ground and to a node 34. A cathode of Schottky diode 303 is connected to a first lead of a capacitor 304 which has a second lead connected to node 26. The cathode of diode 303 is also connected to a first lead of a resistor 307 and to a node 29.

A second lead of resistor 307 is connected to a base of an NPN transistor 308 which has an emitter connected to ground across a resistor 309. Resistor 305 has a second lead connected to a base of an NPN transistor 306 having an emitter connected to the emitter of transistor 308. A collector of transistor 306 is connected to a collector of transistor 308, to a node 28 across a capacitor 313, to a first lead of a resistor 310, and to a first lead of a resistor 311.

A second lead of resistor 310 is connected to node 21. A second lead of resistor 311 is connected to a first lead of a capacitor 312, a second lead of which is connected to ground.

AGC amplifier 35 has a resistor 350 with a first lead connected to the first lead of capacitor 312 in AGC detector 30 and to a first lead of a resistor 353. A second lead of resistor 350 is connected to a first lead of a capacitor 351 and to a first electrode of a Field Effect Transistor (FET) 352. A second lead of capacitor 351 is connected to ground. A second electrode of FET 352 is connected to node 18, while a third lead of FET 352 is connected to node 19. A second lead of resistor 353 is connected to a first electrode of FET 355 and to a first electrode of a capacitor 354, a second lead of which is connected to ground. A second electrode of FET 355 is connected to node 14, while a third electrode of FET 355 is connected to node 17.

Referring now to FIG. 5, elements also shown in FIGS. 1, 2, 3 and 4 are referenced by the same numerals used to identify them therein.

Within second harmonic clock extractor 40, a capacitor 407 has a first lead connected to node 23, and has a second lead connected to a base of an NPN transistor 402 and to a first lead of a resistor 400. A second lead of resistor 400 and a first lead of a resistor 401 are connected to a common ground. A second lead of resistor 401 is connected to a base of an NPN transistor 403 and to a first electrode of a capacitor 408, a second electrode of which is connected to node 24. An emitter of transistor 402 is connected to an emitter of transistor 403 and to a first lead of a resistor 404. The second lead of resistor 404 is connected to node 13. A collector of transistor 402 is connected to a collector of transistor 403, to a first lead of a capacitor 405, and to a first lead of a resistor 406. A second lead of resistor 406 is connected to node 21. A second lead of capacitor 405 is connected to ground and to node 34.

Clock recovery circuit 45 contains a first capacitor 450 having a first lead connected to the collectors of transistors 402 and 403 in clock extractor 40. A second lead of capacitor 450 is connected to a base of an NPN transistor 451 and to a first lead of a resistor 452. A second lead of resistor 452 is connected to ground. A first lead of a resistor 453 is connected to the second lead of capacitor 450. An emitter of transistor 457 is connected to a first lead of a resistor 460, a second lead of which is connected to ground. A first lead of a capacitor 459 is connected to the emitter of transistor 457, while a second lead of capacitor 459 is connected to ground.

A second lead of resistor 453 is connected to a first lead of a capacitor 454, a second lead of which is connected to ground. A first lead of a resistor 455 is connected to the second lead of resistor 453, while a second lead of resistor 455 is connected to node 21. A first lead of a capacitor 457 is connected to the second lead of resistor 453, to a first lead of a variable capacitor 458 and to a first lead of a first winding of a transformer 456. A second lead of capacitor 457 is connected to a second lead of variable capacitor 458 and to a second lead of transformer 456. A center tap of the first winding of transformer 456 is connected to a collector of transistor 451.

A first lead of a second winding of transformer 456 is connected to a first lead of a resistor 500 and to a first input of an operational amplifier 502 in clock amplifier 50. A second lead of the second winding of transformer 456 is connected to a first lead of a resistor 501 and to a second input of amplifier 502 in clock amplifier 50. A second lead of resistor 500 and a second lead of resistor 501 are connected to a common ground. A first lead of a capacitor 503 is connected to node 21 and to a third input of amplifier 502. A first lead of a capacitor 504 is connected to a fourth input of amplifier 502 and to node 13. A second lead of each of capacitors 503 and 504 is connected to the same ground to which the second lead of resistor 501 is connected. A fifth input of amplifier 502 is connected to a first lead of resistor 505 which has a second lead connected to a sixth input of amplifier 502.

A first output of amplifier 502 is connected to a first lead of a resistor 550 within clock phase adjust 55. A second lead of resistor 550 is connected to a first lead of capacitor 551, a second lead of which is connected to a first lead of a variable capacitor 552 and to a node 36. A second lead of variable capacitor 552 is connected to a first lead of a capacitor 553 and to a node 37. A second lead of capacitor 553 is connected to a first lead of a resistor 554 which has a second lead connected to a second output of amplifier 502 in clock amplifier 50.

Turning now to FIG. 6, elements also appearing in any or all of FIGS. 1 through 5 are referred to by the same numerals used to identify them in FIGS. 1 through 5.

Within clock level translator 60 a resistor 600 has a first lead connected to node 36 and to a noninverting first input of a differential amplifier 601. A second lead of resistor 600 is connected to ground. A first lead of a resistor 602 is connected to node 37 and to an inverting second input of amplifier 601. A second lead of resistor 602 is connected to the second lead of resistor 600. A third input of amplifier 601 is connected to a first lead of a capacitor 603 and to node 21. A second lead of capacitor 603 is connected to the second lead of resistor 600. A first lead of a capacitor 604 is connected to a fourth input of amplifier 601 and to node 13. A second lead of capacitor 604 is connected to the second lead of resistor 600. A first output of amplifier 601 is connected to a first terminal of a jumper 605. A second output of amplifier 601 is connected to a first terminal of a jumper 606.

Within data extractor 70, a noninverting first input of a differential amplifier 700 is connected to node 27. An inverting second input of amplifier 700 is connected to node 29. A first lead of a capacitor 701 is connected to a third input of amplifier 700 and to node 21. A second lead of capacitor 701 is connected to ground. A first lead of a capacitor 702 is connected to a fourth input of amplifier 700 and to node 13. A second lead of capacitor 702 and a first lead of a capacitor 703 are connected to the second lead of capacitor 701. A second lead of capacitor 703 is connected to node 28.

Within data extractor 65, a D input of a type D flip-flop 650 is connected to an output of amplifier 700 in data extractor 70. A clock input C of flip-flop 650 is connected to a second terminal of jumper 605 and to a second terminal of jumper 606 in clock level translator 60. A preset input $\bar{P}$ and a reset input $\bar{R}$ of flip-flop 650 are connected to a node 31 at a potential of $+V_1$.

A first input of a NAND gate 750 in line driver 75 is connected to a Q output of flip-flop 650. A second input of NAND gate 750 is connected to node 31. A first input of a NAND gate 751 is connected to the second terminals of jumpers 605 and 606 within clock level translator 60. A second input of NAND gate 751 is connected to node 31. An output of NAND gate 750 is connected to a node 32 providing a data output, and an output of NAND gate 751 is connected to a node 33, providing a clock output.

The properties, and source where appropriate, for the elements of the fiber optic receiver shown in FIGS. 2 through 6 are set forth in Table I.

TABLE I

| Resistors | Resistance in k-ohms |
|---|---|
| 101, 106 | 100 |
| 103, 108 | 27 |
| 105, 110, 310, 452 | 2.2 |
| 154, 155, 163, 250, 251, 257, 258, 500, 501 | 4.7 |
| 156, 169, 200, 202, 550, 554 | 0.330 |
| 161, 164, 165, 453 | 10 |
| 162, 180, 182 | 1.5 |
| 166 | 11 |
| 181 (adjusted on test), 183 (adjusted on test), 311 | 22 |
| 302 | 0.01 |
| 305, 307, 400, 401 | 1.0 |
| 309, 460 | 0.1 |
| 350, 353 | 39 |
| 404 | 0.680 |
| 406 | $330 \times 10^6$ |
| 455 | 0.22 |
| 505 (adjusted on test) | 0.47 |
| 600, 602 | 2.7 |

| Capacitors | Capacitance in microfarads; material |
|---|---|
| 102, 107 | 0.1; tantalum |
| 150, 153, 160, 170, 184, 185, 186, 253, 254, 255, 256 260, 261, 300, 304, 351, 354, 454, 503, 504, 551, 553, 603, 604, 701, 702, 703 | |
| 104, 109, 312 | 4.7; tantalum |
| 201, 203 | $15 \times 10^{-6}$; ceramic |
| 262, 263, 405, 407, 408, 450, 459, 457 | $33 \times 10^{-6}$; ceramic |
| 458, 552 | adjustable |
| Transformer Core | |
| 456 | Part No. 50-10, available from Amidon, North Hollywood, California |
| Diodes | |
| 100 | PIN; Part No. C30971EL available from RCA, Ontario, Canada |
| 159 | 1N4148 |
| 301, 303 | Schottky; Part No. HP5082-2811, available from Hewlett Packard, Mountain View, California |
| Transistors | |
| 151, 152, 167, | NPN; Part No. MRF904, avail- |

TABLE I-continued

| | |
|---|---|
| 168, 306, 308 402, 403, 451 | able from Motorola, Inc., Phoenix, Arizona |
| 157, 158 | PNP; Part No. 2N4957 |
| 352, 355 | n-channel, insulated gate, enhancement-mode FET; Part No. D211-233, available from Signetics Corporation, Sunnyvale, California |
| Amplifiers | |
| 252, 259, 502 | Part No. µA733, available from Fairchild Semiconductor, Mountain View, California |
| 601, 700 | Part No. LM360N, available from National Semiconductor, Santa Clara, California |
| Logic Elements | |
| 650 | Type D flip-flop, Part No. 74S74, available from Texas Instruments, Dallas, Texas |
| 750, 751 | NAND gates, Part No. 74S540, available from Texas Instruments, Dallas, Texas |

In the operation of the fiber optic receiver as illustrated in FIGS. 2 through 6, an optical signal modulated by a biphase AMI-encoded data stream and having a correspondingly wide modulation bandwidth is applied to PIN diode 100. Diode 100 acts as a current source providing about 0.5 amperes per watt of incident light. The cathode of diode 100 is coupled to a first transimpedance amplifier including transistors 151, 157, and 167 within preamplifier 15. The anode of diode 100 is coupled to a second transimpedance amplifier, including transistors 152, 158, and 168 within preamplifier 15. To each of these transimpedance amplifiers, the other appears as a virtual ground. Preamplifier 15, and the stages which follow it, are symmetrical about a center line along which corresponding symmetrical elements are grounded. As a result, there is no net ground current across any amplifier stage. This symmetrical construction minimizes the introduction of stray noise signals.

The symmetrical transimpedance amplifiers within preamplifier 15 are balanced. The construction of preamplifier 15 allows diode 100 to be "floated" between two relatively large bias resistances respectively including resistors 101, 103, and 105 and resistors 106, 108, and 110. By avoiding a low impedance connection between diode 100 and the system ground, as is necessary in single-ended systems, it is possible to avoid the introduction of ground noises into the front-end. To further aid noise reduction, the combinations of resistor 105 and capacitor 104, and resistor 110 and capacitor 109 decouple low frequency noise from a power supply connected to nodes 11 and 12. The combination of resistor 101 and capacitor 102 and resistor 108 and capacitor 107 provide additional high frequency decoupling grounded to the center line of preamplifier 15.

A current signal supplied by diode 100 is coupled to preamplifier 15 in which the current signal is converted into a voltage signal. Within preamplifier 15, UHF-type transistors having low Miller capacitances (Ccb) are used, allowing relatively larger resistors to be used within preamplifier 15. The use of larger resistors results in the operation of the transistors within preamplifier 15 with minimum bias currents, further reducing noise. The symmetrical amplifiers within preamplifier 15 are locked together by resistor 166 in order to reduce cross-phase distortion, i.e., in order to reduce the difference in phase delay between the two amplifiers. The voltage signal appears at the emitters of transistors 167 and 168.

Low pass filter 20 removes noise beyond the data rate, which noise is produced by devices in the preamplifier. Operational amplifiers 252 and 259 provide two stages of amplification for the voltage signals filtered by low pass filter 20.

Throughout preamplifier 15, low pass filter 20, and amplifier 25, the data stream is preserved in the form of two signals separated by 180° in phase. These balanced signals are DC blocked and coupled to clamp and detector 30 by capacitors 300 and 304.

Like the stages which preceded it, clamp and detector 30 has two halves organized symmetrically about a center line, which halves are identical in operation but opposite in phase. For example, considering only the half of clamp and detector 30 including transistor 306 and Schottky diode 101, during a negative excursion of the output signal at the first output of amplifier 252, diode 301 conducts through resistor 302, causing the voltage across the cathode of diode 301 to be clamped at one diode drop below ground (approximately −0.4 volts). If the signal causes a positive excursion more than 0.6 volts positive, i.e., more than one volt above the clamp of negative excursion, the circuit begins to conduct through resistor 305 into the base of transistor 306. Thus, a signal with an amplitude greater than one volt causes conduction through the base-emitter of transistor 306 so that a collector current is drawn from the collector to the emitter of transistor 306, which collector current is proportional to the ratio of the value of the resistance of resistor 310 and the value of the resistance of resistor 309. This collector current constitutes a signal which is applied to the low pass filter made up of resistor 311 and capacitor 312, causing detection of the signal. The signal is then used to control the gain of amplifiers 252 and 259 through resistor 350 and FET 352, and resistor 353 and FET 355, respectively.

As illustrated in FIG. 7, a simplified schematic of a circuit found within a typical amplifier suitable for use as amplifier 252 or amplifier 259 provides two alternative configurations for connection to a FET in gain control amplifier 35. FIG. 7 illustrates alternative connections to nodes 14 and 17, as nodes 14a and 17a, and as nodes 14b and 17b. FETs 352 and 355 vary the resistance between emitters of two input transistors within amplifier 252 and amplifier 259, respectively. Connection to nodes 14a and 17a provides relatively greater gain than does connection to nodes 14b and 17b.

The action of the bottom half of clamp and detector 30 is symmetrical and identical. Therefore, for each pulse in a data stream applied to diode 100, 2 pulses are available for firing AGC amplifier 35 through clamp and detector 30, which reduces the time constant of the circuit formed by resistor 311 and capacitor 312 so that the response time for the automatic gain control circuit according to the present invention is faster by a factor of 2 than for normal automatic gain control circuits.

Therefore, within the AGC clamp and detector according to the present invention, signals are always clamped as seen at the cathode of diodes 301 and 303 with an excursion of 0.4 volts negative to 0.6 volts positive. If the excursion is greater than 0.6 volts positive, transistors 306 and 308 pull down the voltage by turning down the gains of amplifiers 252 and 259. In this way, the AGC detector according to the present invention combines automatic gain control and clamping in one circuit with a fast response time and without loop instability.

The second harmonic clock extractor according to the present invention as illustrated in FIG. 5 acts as a zero crossing detector in which the voltage on the emitter circuit of transistors 402 and 403 follows the more positive of the second lead of capacitor 407 or the first lead of capacitor 408. The AMI-encoded data stream as it appears before transmission is illustrated by the ideal waveform shown in FIG. 8 at A. The data stream at the first output of amplifier 259 may be drawn as the ideal waveform illustrated in FIG. 8 at B. The data stream appearing at the output of second amplifier 259 is illustrated by the ideal waveform of FIG. 8 at C. The ideal waveforms of FIG. 8 at B and at C are combined by transistors 402 and 403 so that the current through resistor 409 looks like a fully rectified inversion of the combination of the data streams at the two outputs of amplifier 259, as shown in FIG. 8 at D. This fully rectified combined data stream has negative going peaks like a fully rectified sine wave. The negative going peaks are inverted at the collectors of transistors 402 and 403.

Within clock recovery 45, resistors 452 and 453 bias transistor 451 on the edge of conduction, slightly into conduction. Thus, the positive spikes applied to the base of transistor 451 by the collectors of transistors 402 and 403 cause current spikes to be produced in the collector circuit of transistor 451. Capacitor 459 sharpens (differentiates) the spikes by presenting the transitions of each spike with a low impedance. Resistor 455 and capacitor 454 provide power supply decoupling.

The current spikes of transistor 451 ring the high Q resonance circuit composed of the toroidal coil, formed by the first winding of transformer 456, and of parallel resonating capacitors 457 and 458, which tune the tank circuit formed thereby. This tank circuit is tuned by varying the capacitance of capacitor 458 to resonate at a second harmonic of the data rate. The first winding of transformer 456 has 10 turns below and 4 turns above the center tap connected to the collector of transistor 451. The ringing signal produced in the tank circuit is coupled to the second winding of transformer 456, which has 3 turns and which has its first and second ends connected respectively to the first and second inputs of amplifier 502.

Amplifier 502 has a fixed gain set by resistor 505, which is connected across nodes internal to amplifier 502, corresponding to nodes 14b and 17b as illustrated in FIG. 7. Resistor 505 fixes the gain of amplifier 502 so that amplifier 502 operates its in linear range and so that there is no clipping of the input signal.

The output signals from amplifier 502 are in the form of sine waves at the second harmonic of the data rate. The phase shift angle of the sine waves is varied by changing the RC time constant of variable capacitor 552 and resistors 550 and 554, respectively. Capacitors 551 and 553 act as blocking capacitors. Resistors 600 and 602 bias comparator 601. Comparator 601 generates square wave at the same frequency as the sine wave outputs of amplifier 502. The square waves on the first and second outputs of comparator 601 are 180° out of phase so that either jumper 605 or jumper 606, but not both are connected to flip-flop 650 and NAND gate 751 in order to select between a normal or inverted phase in the clock stream.

The data stream is applied to the 2 inputs of comparator 700 in the form of 2 signals separated by 180° in phase. Comparator 700 changes the data stream into a square wave by comparing the signals applied to its input so that the edges of the bits in the data stream of the output of comparator 700 are determined by the crossover points of the signals at the inputs of comparator 700 as shown in FIG. 8 at E.

However, under weak signal conditions noise in these signals leads to jittering of the edges of the data cells due to moving of the crossover points. If the jitter is bad enough, errors in decoding can result. In order to correct for this edge jitter, the data signal at the output of comparator 700 is applied to the D input of retiming latch 650, and the state of the data is clocked into the latch only at the clock edge extracted by the ringing tank in clock recovery circuit 45. Because the tank in clock recovery circuit 45 only rings at its natural frequency, it filters the jitter and reimposes a clean clock signal on the data through retiming latch 650. Because the preset and reset inputs of type D flip-flop 650 are connected to a node at a logic level of 1, the output of flip-flop 650 is totally controlled by the state of the D input when clocked at the C input. Because the second inputs of NAND gates 750 and 751 are tied to a logic level of 1, a high output signal at the Q output of flip-flop 650 provides an output of NAND gate 750 in the form of data output signal which is inverted from the signal at the Q output of flip-flop 650. Likewise, the output of NAND gate 751 is inverted from the output of comparator 601.

The use of a "ringing tank" circuit in an oscillator for clock recovery is much simpler and less trouble prone than the use of a PLL. An AMI code provides a substantial amount of energy at twice the data rate, and thus a relatively simple, lower Q tank circuit may be employed.

Flip-flop 650 traps each bit at the precise center of the data cell so that errors are minimized and edge jitter is eliminated.

While the present invention has been described in terms of a preferred embodiment, further modifications and improvements will occur in those skilled in the art. For example, although an AMI-encoded data stream has been described herein, any DC-balanced biphase code may be employed.

I desire to be understood, therefore, that this invention is not limited to the particular form shown, that I intend in the appended claims to cover all such equivalent variations which come within the scope of the invention as claimed.

What is claimed is:

1. A combined baseline clamp and automatic gain control detector comprising:
   means for providing a first data signal;
   means for providing a second data signal identical to said first data signal but shifted 180° in phase;
   a first clamping diode having a first electrode coupled to said means for providing a first data signal and having a second electrode coupled to a common potential;
   a second clamping diode having a first electrode coupled to said means for providing a second data signal and having a second electrode coupled to the common potential;
   a first transistor having a base coupled to said first electrode of said first clamping diode, having an emitter and having a collector; and
   a second transistor having a base coupled to said first electrode of said second clamping diode, having an emitter coupled to said emitter of said first transistor, and having a collector coupled to said collector of said first transistor;

wherein the signal from said coupled collectors of said first transistor and said second transistor is a gain control signal.

2. The combined baseline clamp and automatic gain control detector as recited in claim 1 wherein said first clamping diode and said second clamping diode are Schottky diodes.

3. The combined baseline clamp and automatic gain control detector as recited in claim 1 wherein said first transistor and said second transistor are NPN transistor.

4. The combined baseline clamp and automatic gain control detector as recited in claim 1 wherein said first transistor and said second transistor are PNP transistors.

5. A fiber optic receiver comprising:
a photodetector;
a data amplifier coupled to said photodetector;
a data clock extractor coupled to said data amplifier;
a combined baseline clamp and automatic gain control detector comprising
  means, coupled to said data amplifier, for providing a first data signal;
  means, coupled to said data amplifier, for providing a second data signal identical to said first data signal but shifted 180° in phase;
  a first clamping diode having a first electrode coupled to said means for providing a first data signal and having a second electrode coupled to a common potential;
  a second clamping diode having a first electrode coupled to said means for providing a second data signal and having a second electrode coupled to the common potential;
  a first transistor having a base coupled to said first electrode of said first clamping diode, having an emitter and having a collector; and
  a second transistor having a base coupled to said first electrode of said second clamping diode, having an emitter coupled to said emitter of said first transistor, and having a collector coupled to said collector of said first transistor;
  wherein the signal from said coupled collectors of said first transistor and said second transistor is a gain control signal;
a data extractor coupled to said coupled collectors of said first transistor and said second transistor of said combined baseline clamp and automatic gain control detector;
a data retiming circuit coupled to said data extractor and coupled to said data amplifier; and
an automatic gain control amplifier having an input coupled to an output of said baseline claim and automatic gain control detector and having an output coupled to an input of said data amplifier.

6. The fiber optic receiver as recited in claim 5 wherein said first clamping diode and said second clamping diode are Schottky diodes.

7. The fiber receiver as recited in claim 5 wherein said first transistor and said second transistor are NPN transistors.

8. The fiber optic receiver as recited in claim 5 wherein said first transistor and said second transistor are PNP transistors.

9. The fiber optic receiver of claim 5 wherein the data clock extractor coupled to said data amplifier comprises
a full wave rectifier providing an output signal having peaks indicative of transitions in a data stream,
a peak detector coupled to receive signals from said full wave rectifier,
an oscillator, and
means, coupled between said peak detector and said oscillator, for stimulating said oscillator with said peaks detected by said peak detector.

10. The data clock extractor as recited in claim 5 wherein said oscillator comprises a tank circuit.

* * * * *